US010624247B2

(12) United States Patent
Wakayama

(10) Patent No.: US 10,624,247 B2
(45) Date of Patent: Apr. 14, 2020

(54) CIRCUIT BOARD, ELECTRONIC CONTROL UNIT, AND SWITCHING CONTROL METHOD OF ELECTRONIC CONTROL UNIT

(71) Applicant: TOYOTA JIDOSHA KABUSHIKI KAISHA, Toyota-shi, Aichi-ken (JP)

(72) Inventor: Yuki Wakayama, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 304 days.

(21) Appl. No.: 15/716,988

(22) Filed: Sep. 27, 2017

(65) Prior Publication Data

US 2018/0110160 A1 Apr. 19, 2018

(30) Foreign Application Priority Data

Oct. 17, 2016 (JP) .................................. 2016-203259

(51) Int. Cl.
| | |
|---|---|
| *H05K 1/18* | (2006.01) |
| *H05K 9/00* | (2006.01) |
| *H05K 1/02* | (2006.01) |
| *H05K 5/00* | (2006.01) |

(52) U.S. Cl.
CPC ......... *H05K 9/0064* (2013.01); *H05K 1/0215* (2013.01); *H05K 1/0218* (2013.01); *H05K 1/0298* (2013.01); *H05K 5/006* (2013.01); *H05K 9/0039* (2013.01); *H05K 1/024* (2013.01); *H05K 1/18* (2013.01); *H05K 2201/09736* (2013.01)

(58) Field of Classification Search
USPC .................................. 361/679.31, 780, 794
See application file for complete search history.

(56) References Cited

U.S. PATENT DOCUMENTS

| 5,912,597 A * | 6/1999 | Inagawa ............... H05K 1/0216 174/265 |
| 2014/0192477 A1* | 7/2014 | Yoshihara ............ H05K 1/0251 361/679.31 |
| 2015/0029682 A1 | 1/2015 | Kadoya et al. |
| 2017/0033426 A1 | 2/2017 | Baba et al. |

FOREIGN PATENT DOCUMENTS

| JP | 2013-197223 A | 9/2013 |
| WO | 2016/088592 A1 | 6/2016 |

* cited by examiner

*Primary Examiner* — Danny Nguyen
(74) *Attorney, Agent, or Firm* — Oliff PLC

(57) ABSTRACT

An electronic control unit includes; a circuit board including a plurality of layers, the layers including a plurality of ground layers having different thicknesses from one another; a drain line connected to the circuit board; a switching device configured to selectively connect the drain line to one of the plurality of ground layers based on a frequency of an electromagnetic wave inside a vehicle cabin; and a controller configured to control the connection of the switching device based on the frequency of the electromagnetic wave inside the vehicle cabin.

8 Claims, 5 Drawing Sheets

CIRCUIT BOARD, ELECTRONIC CONTROL UNIT, AND SWITCHING CONTROL METHOD OF ELECTRONIC CONTROL UNIT

INCORPORATION BY REFERENCE

The disclosure of Japanese Patent Application No. 2016-203259 filed on Oct. 17, 2016 including the specification, drawings and abstract is incorporated herein by reference in its entirety.

BACKGROUND

1. Technical Field

The present disclosure relates to a circuit board including a plurality of layers, an electronic control unit including a circuit board, and a switching control method of an electronic control unit.

2. Description of Related Art

Japanese Unexamined Patent Application Publication No. 2013-197223 (JP 2013-197223 A) describes an electronic control unit including a circuit board including a plurality of layers, a metallic body that holds the circuit board, and a resin cover that covers the circuit board. In the circuit board, a ground pattern is formed in a first layer on the resin cover side among the layers, and an important signal pattern and a ground pattern are formed in a second layer below the first layer. With this, the important signal pattern is protected from noise transmitted through the resin cover.

SUMMARY

The disclosure makes an electromagnetic wave inside a vehicle cabin and noise emitted from an electronic control unit hard to resonate with each other.

A first aspect of the disclosure relates to a circuit board including a plurality of layers. The layers include a plurality of ground layers (hereinafter, referred to as GND layers) having different thicknesses from one another. When the GND layers are different in thickness, the GND layers are different in impedance and are different in resonance frequency. With the above, for example, a resonance frequency of noise emitted from the electronic control unit is changed, whereby it is possible to make noise hard to resonate with an electromagnetic wave inside a vehicle cabin.

A second aspect of the disclosure relates to an electronic control unit including a circuit board, a drain line, a switching device, and a controller. The circuit board including a plurality of layers, the layers include a plurality of ground layers having different thicknesses from one another. The drain line is connected to the circuit board. The switching device is configured to selectively connect the drain line to one of the plurality of ground layers based on a frequency of an electromagnetic wave inside a vehicle cabin. The controller is configured to control the connection of the switching device based on the frequency of the electromagnetic wave inside the vehicle cabin.

In the electronic control unit according to the aspect of the disclosure, the controller may be configured to perform control such that the switching device connects the drain line to a relatively thicker ground layer when a radio frequency that is a frequency of an electric wave of radio as the electromagnetic wave inside the vehicle cabin is low than when the radio frequency is high.

In the electronic control unit according to the aspect of the disclosure, the circuit board may include two ground layers as the ground layers. The controller may be configured to perform control such that the switching device connects the drain line to a thinner ground layer out of the two ground layers when the radio frequency belongs to an FM bandwidth, and perform control such that the switching device connects the drain line to a thicker ground layer out of the two ground layers when the radio frequency belongs to an AM bandwidth.

In the electronic control unit according to the aspect of the disclosure, the thicknesses of the two ground layers may be in a range of 50 μm to 120 μm and in a range of 20 μm to 70 μm, respectively.

In the electronic control unit according to the aspect of the disclosure, the difference in thickness between the two ground layers may be 10 μm to 30 μm.

The electronic control unit according to the aspect of the disclosure may further include a resin body configured to hold the circuit board, and a resin cover configured to cover the circuit board along with the resin body.

In the electronic control unit according to the aspect of the disclosure, the electronic control unit may be attached to a caliper of at least one of a plurality of wheels of a vehicle.

A third aspect of the disclosure relates to a switching control method of an electronic control unit. The electronic control unit includes a circuit board, a drain line, a switching device, and a controller. The circuit board includes a plurality of layers, the layers including a plurality of ground layers having different thicknesses from one another. The drain line is connected to the circuit board. The switching device is configured to selectively connect the drain line to one of the plurality of ground layers. The switching control method includes acquiring, with the controller, a frequency of an electromagnetic wave inside a vehicle cabin, determining, with the controller, whether or not the acquired frequency is in an FM bandwidth, and when determination is made with the controller that the acquired frequency is in the FM bandwidth, performing control such that the switching device connects the drain line to a relatively thinner ground layer than when determination is made that the frequency is not in the FM bandwidth.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
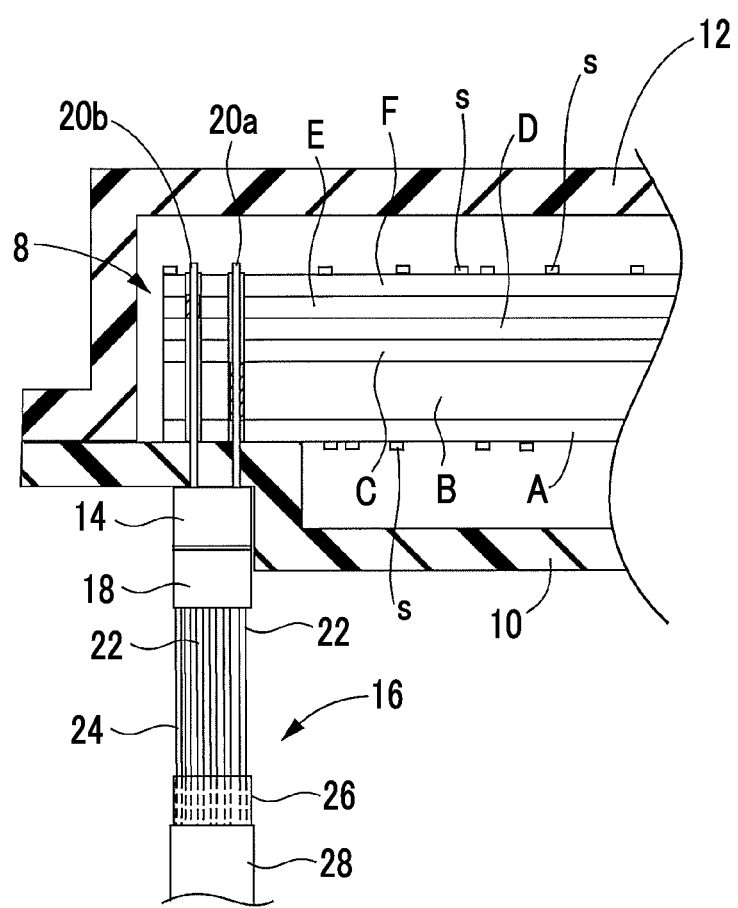
FIG. 1 is a partial sectional view conceptually showing an electronic control unit.

Hereinafter, an electronic control unit that is an embodiment of the disclosure will be described in detail referring to the drawings.

Figure 2:
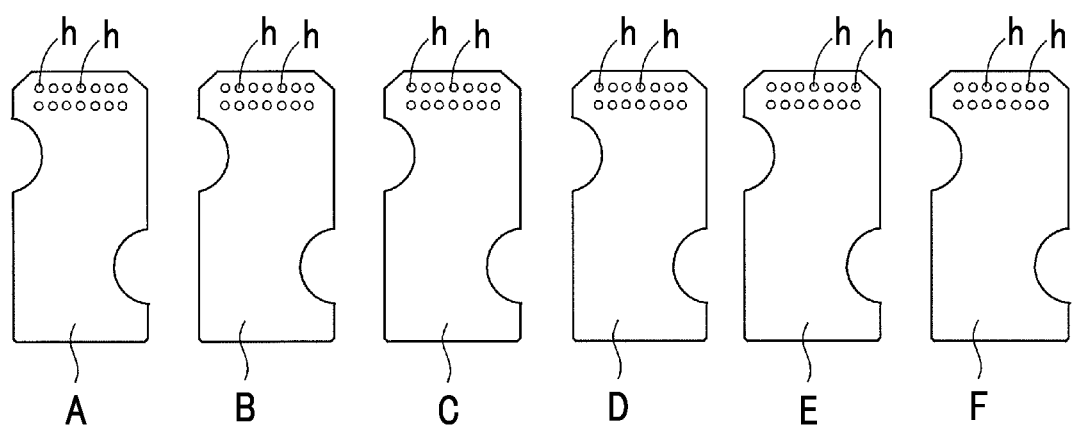
FIG. 2 is a plan view showing layers of a circuit board constituting the electronic control unit.

As shown in FIGS. 1 and 2, the electronic control unit includes a circuit board 8 that includes a plurality of layers A to F, electronic components s mounted on the front surface and the rear surface of the circuit board 8, and the like. Among the layers A to F, a first layer A, a third layer C, a fourth layer D, and a sixth layer F are signal layers, power supply layers, or the like, and a second layer B and a fifth layer E are ground layers (hereinafter, referred to as GND layers). A signal layer is a layer where there is a conductor pattern of a signal line for primarily transmitting a signal, a power supply layer is a conductor layer that is used in order to primarily perform power supply, and a GND layer is a conductor layer that is used for connection to the ground to have a ground potential, power supply, or the like. The layers A to F are laminated through insulators. A plurality of through-holes h is provided such that the through-holes h are formed at corresponding positions of the layers A to F. The second layer B is thicker than the fifth layer E.

The circuit board 8 is held by a resin body 10, and is covered with a resin cover 12. In a state in which the circuit board 8 is held by the body 10, a plurality of bus bars 20 passes through the through-holes h of the first layer A to the sixth layer F. Among the bus bars 20, a bus bar 20a is connected to the second layer B such that electrical conduction is provided therebetween, and a bus bar 20b is connected to the fifth layer E such that electrical conduction is provided therebetween. The body 10 is provided with a body side connector 14, to which a wire harness 16 is connected through a harness side connector 18.

Figure 3:
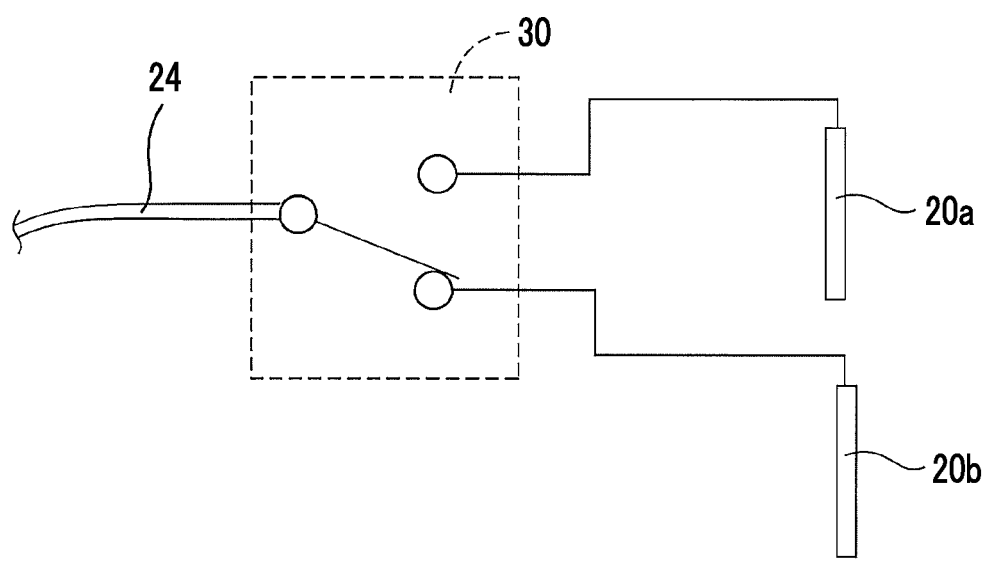
FIG. 3 is a diagram conceptually showing a switch included in the electronic control unit.

The wire harness 16 is a shielded line and includes a plurality of signal lines, power lines 22, and a drain line 24, and the elements are covered with a coating material 28 through a shield layer 26. As shown in FIG. 3, the drain line 24 is connected to bus bars 20a, 20b through a switch 30, and is selectively connected to either of the second layer B or the fifth layer E that are the GND layers. While the switch 30 is at an original position shown in the drawing, the switch 30 is controlled to switch the drain line 24 from a state of being connected to the bus bar 20b to a state of being connected to the bus bar 20a. As the switch 30, for example, a contactless semiconductor switch can be used.

When the GND layers, to which the drain line 24 is connected, are different in thickness, the magnitude of impedance Z' of the circuit is different and a resonance frequency fc is different. The impedance Z' is represented by the following expression.

$$Z' = R + j(\omega L - 1/\omega C)$$

The resonance frequency fc is represented by the following expression.

$$fc = 1/\{2\pi\sqrt{(LC)}\}$$

In general, when the thickness of the GND layer is large, the impedance Z' becomes smaller than when the thickness of the GND layer is small. From the two expressions described above, when the impedance Z' becomes small, it is presumed that inductance L and capacitance C become small and the resonance frequency fc is likely to become large.

Figure 4:
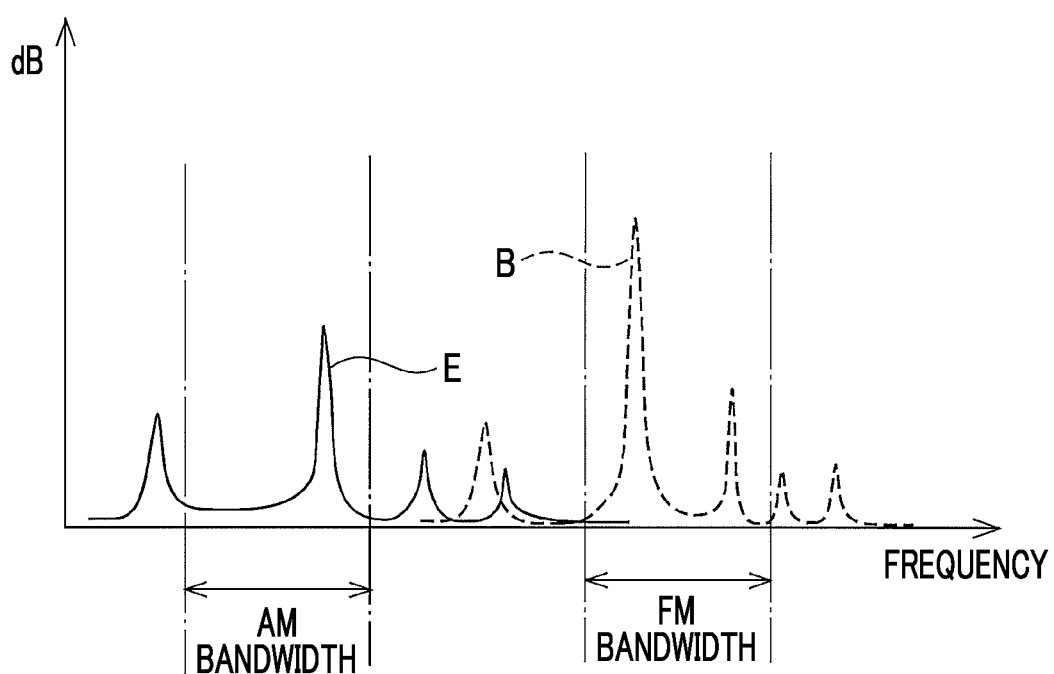
FIG. 4 is a diagram showing an example of a case of performing frequency analysis of noise emitted from the electronic control unit.

FIG. 4 shows an example of a case of executing frequency analysis of noise actually emitted from the electronic control unit. A solid line is an example of a case where the drain line 24 is connected to the fifth layer E, and a broken line is an example of a case where the drain line 24 is connected to the second layer B. From the solid line and the broken line of FIG. 4, it will be apparent that, when the drain line 24 is connected to the second layer B, the resonance frequency fc of noise emitted from the electronic control unit becomes greater than when the drain line 24 is connected to the fifth layer E.

Figure 5:
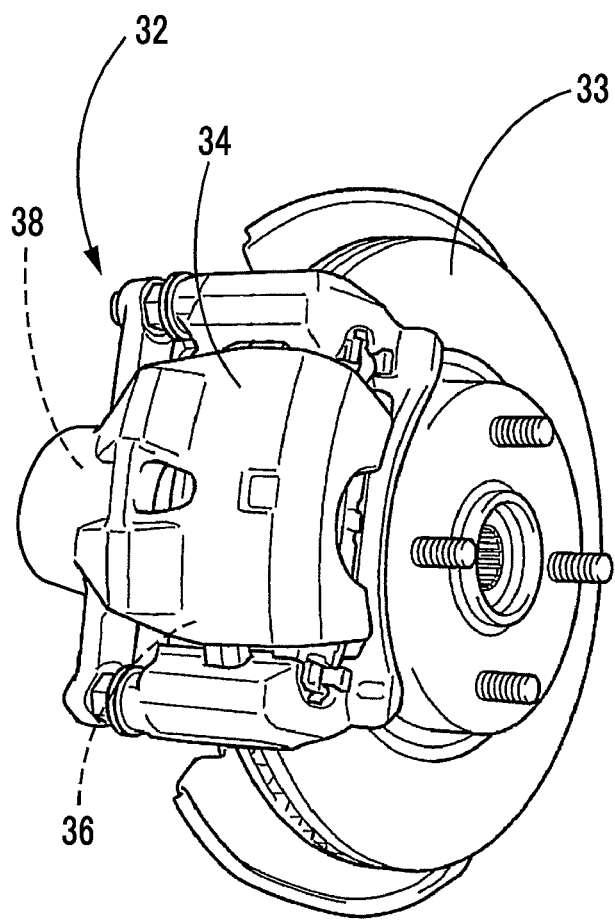
FIG. 5 is a diagram showing an attachment state of an EMBECU as the electronic control unit.

For example, as shown in FIG. 5, the electronic control unit can be provided in an electric brake device 32 that is provided in a part of a plurality of wheels of a vehicle. The electric brake device 32 includes (i) an electric brake that includes a caliper 34 provided in a state in which a disc rotor 33 rotatable integrally with the wheel strides, and an electric motor 36 held by the caliper 34, and that is operated by the electric motor 36 to suppress the rotation of the wheel, and (ii) an electromechanical brake (EMB) ECU38 that is held by the caliper 34 and controls the electric motor 36. For the EMB ECU38, the electronic control unit is employed. In the EMB ECU38, for example, the thickness of the second layer B can be set to 100 μm, and the thickness of the fifth layer E can be set to 30 μm.

Figure 6:
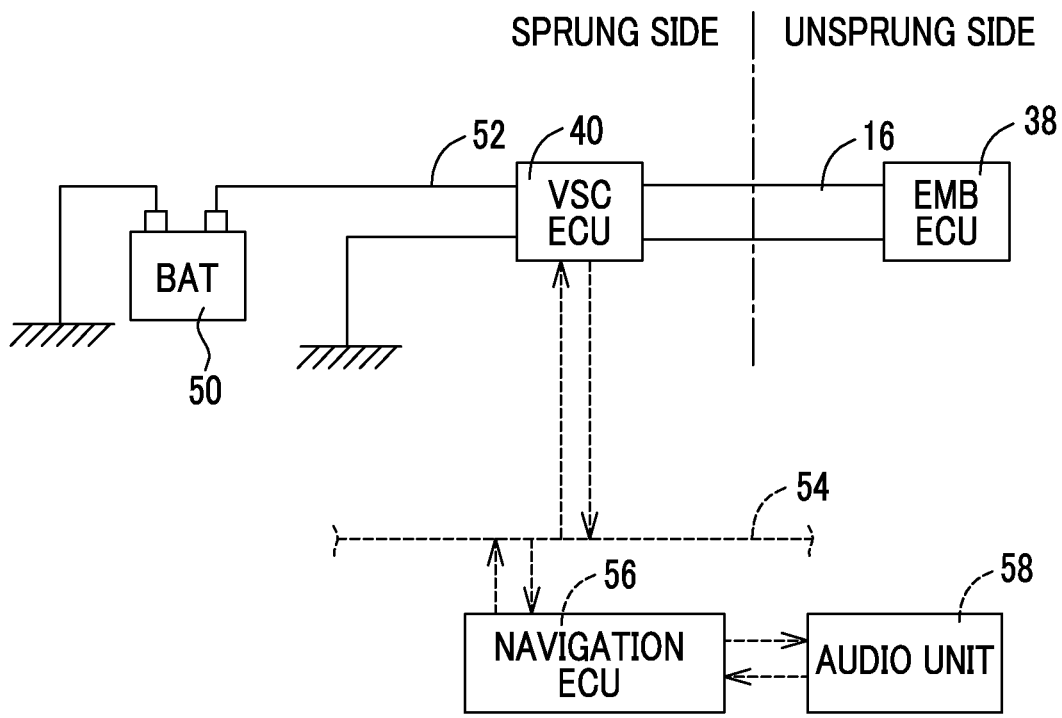
FIG. 6 is a diagram conceptually showing the periphery of the EMBECU.

As described above, the EMB ECU38 is provided on an unsprung side, and as shown in FIG. 6, is connected to a vehicle stability control (VSC) ECU40 attached to a sprung side through the wire harness 16. A battery 50 as a power supply provided in the vehicle is connected to the VSC ECU40 through a wire harness 52. The VSC ECU40 controls hydraulic pressure of a hydraulic brake provided in a wheel not provided with electric brake device 32 among the wheels, and is executable antilock control or the like.

The EMB ECU38 and the VSC ECU40 each include a controller primarily constituted of a computer, and are communicable with each other. The VSC ECU40 is connected to a navigation ECU 56 through a car area network (CAN) 54, and an audio unit 58 is connected to the navigation ECU 56 to be communicable with each other. In the audio unit 58, when radio is used, a frequency (hereinafter, referred to as a radio frequency) of a radio electric wave is acquired. The acquired radio frequency is acquired in the EMB ECU38 through the navigation ECU 56, the CAN 54, and the VSC ECU40.

Since the VSC ECU40 is attached to the sprung side, the VSC ECU40 can be grounded using the body. Since the VSC ECU40 is provided in an engine compartment, that is, at a closed place, even if noise is emitted, there is less influence on the inside of the vehicle cabin. In contrast, since the EMB ECU38 is provided on the unsprung side and is covered with the resin body 10 and the cover 12, it is difficult to ground the EMB ECU38. Since the EMB ECU38 is provided on the unsprung side, that is, at an open place, there is a possibility that emitted noise has influence on the inside of the vehicle cabin.

From the above, in the example, the drain line 24 of the wire harness 16 is returned to the VSC ECU40, that is, the sprung side by way of the ground layer in the EMB ECU38, and the resonance frequency of noise emitted from the EMB ECU38 is changed based on a frequency of an electromagnetic wave used inside the vehicle cabin. For example, when radio is used inside the vehicle cabin and when the radio frequency is in an AM bandwidth {while a medium frequency (MF) bandwidth is 300 kHz to 3 MHz, a bandwidth that is used in Japan is 531 to 1602 kHz}, the drain line 24 is connected to the second layer B through the bus bar 20a, and the resonance frequency becomes large. When the radio frequency is in an FM bandwidth {a very high frequency (VHF) bandwidth is 30 MHz to 399 MHz, a bandwidth that is used in Japan is 76.0 to 107.9 MHz}, the drain line 24 is connected to the fifth layer E through the bus bar 20*b*, and the resonance frequency becomes small.

Figure 7:
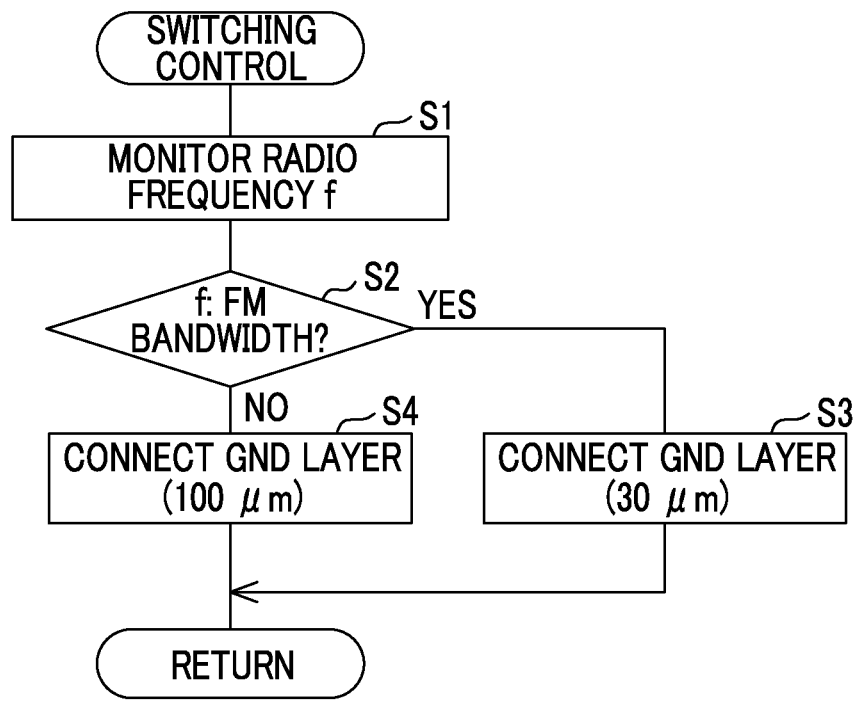
FIG. 7 is a flowchart showing a switch control program stored in a storage unit of the EMBECU.

A switching control program that is represented by the flowchart of FIG. 7 is stored in a storage unit of the EMB ECU38, and is executed at every set time determined in advance in the EMB ECU38. In Step 1 (hereinafter, abbreviated as S1: the same applies to other steps), the radio frequency is acquired, and in S2, determination is made whether or not the acquired radio frequency is in the FM bandwidth. When the radio frequency is in the FM bandwidth, in S3, the switch 30 is at the original position shown in the drawing, and the drain line 24 is connected to the bus bar 20*b*. When the radio frequency is in the AM bandwidth, in S4, the switch 30 is controlled to switch the drain line 24 to a state of being connected to the bus bar 20*a*.

As described above, when the bandwidth of the radio frequency is the FM bandwidth, the resonance frequency fc of noise emitted from the EMB ECU38 or the like becomes small, and when the bandwidth of the radio frequency is the AM bandwidth, the resonance frequency fc of noise emitted from the EMB ECU38 or the like becomes large. As a result, even when the circuit board 8 is covered with the resin body 10 and the cover 12, an electric wave of radio and noise are made hard to resonate with each other. It is also possible to achieve reduction in cost and to satisfactorily avoid radio from becoming hard to hear inside the vehicle cabin. An electromagnetic interference (EMI) filter element or the like as a noise countermeasure is not needed. In the example, the switch 30 of the EMB ECU38, a part that stores the switch control program represented by the flowchart of FIG. 7, a part that executes the switch control program, and the like constitute a switching device.

The thicknesses of the second layer B and the fifth layer E are not necessarily 100 μm and 30 μm, respectively. For example, the thickness of the second layer B can be set to a value in a range of 50 μm to 120 μm, and is desirably set to a value in a range of 70 μm to 100 μm. The thickness of the fifth layer E can be set to a value in a range of 20 μm to 70 μm, and is desirably set to a value in a range of 30 μm to 50 μm. The difference in thickness between the second layer B and the fifth layer E is desirably about 10 μm to 30 μm. The disclosure is not limited to a radio frequency, and in order to avoid resonance with an electromagnetic wave inside the vehicle cabin, a configuration may be made such that resonance with various electromagnetic waves is suppressed. The circuit board 8 may have three or more ground layers. The electronic control unit is not limited as being applied to an electric brake device, and may be applied to other in-vehicle devices. In this way, an aspect of the disclosure can be implemented in aspects to which various modifications and improvements are added based on knowledge of those skilled in the art.

In the following forms, disclosures that are recognized to be claimable in the disclosure, that is, features of the disclosure will be described.

(1) A circuit board including a plurality of layers, in which the layers include a plurality of ground layers having different thicknesses from one another.

The circuit board includes a plurality of two or more ground layers having different thicknesses from one another, and may include three or more ground layers.

(2) An electronic control unit including the circuit board described in the form (1) that includes a plurality of layers, the layers including a plurality of ground layers having different thicknesses from one another; a drain line connected to the circuit board; a switching device configured to selectively connect the drain line to one of the plurality of ground layers based on a frequency of an electromagnetic wave inside a vehicle cabin; and a controller configured to control the connection of the switching device based on the frequency of the electromagnetic wave inside the vehicle cabin.

When the ground layers to which the drain line is connected are different in thickness, impedance of a circuit including the ground layers is different, and a resonance frequency is different. Accordingly, when a configuration is made in which the drain line is connected to a ground layer having a thickness determined based on the frequency of the electromagnetic wave inside the vehicle cabin, it is possible to make noise emitted from the electronic control unit and an electromagnetic wave inside the vehicle cabin hard to resonate with each other. For example, an electric wave of radio corresponds to the electromagnetic wave inside the vehicle cabin.

(3) The electronic control unit described in the form (2), in which the controller is configured to perform control such that the switching device connects the drain line to a relatively thicker ground layer when a radio frequency that is a frequency of an electric wave of radio as the electromagnetic wave inside the vehicle cabin is low than when the radio frequency is high.

When a ground layer is thick, impedance becomes smaller and the resonance frequency is likely to become larger than when a ground layer is thin. For this reason, when the radio frequency is low, the drain line is connected to a relatively thick ground layer, whereby it is possible to make the resonance frequency of noise output from the electronic control unit large, and to make noise hard to resonate with the electric wave of radio.

(4) The electronic control unit described in the form (3), in which the circuit board includes two ground layers as the ground layers, and the controller is configured to perform control such that the switching device connects the drain line to a thinner ground layer out of the two ground layers when the radio frequency belongs to an FM bandwidth, and perform control such that the switching device connects the drain line to a thicker ground layer out of the two ground layers when the radio frequency belongs to an AM bandwidth.

(5) The electronic control unit described in any one of the form (2) to the form (4), further including a resin body configured to hold the circuit board, and a resin cover configured to cover the circuit board along with the resin body.

(6) The electronic control unit described in any one of the form (2) to the form (5), in which the electronic control unit is attached to a caliper of at least one of a plurality of wheels of a vehicle.

(7) A switching control method of an electronic control unit, the electronic control unit including a circuit board that includes a plurality of layers, the layers including a plurality of ground layers having different thicknesses from one another, a drain line connected to the circuit board, a switching device configured to selectively connect the drain line to one of the ground layers, and a controller, the switching control method comprising acquiring, with the controller, a frequency of an electromagnetic wave inside a vehicle cabin, determining, with the controller, whether or not the acquired frequency is in an FM bandwidth, and when determination is made with the controller that the acquired frequency is in the FM bandwidth, performing control such that the switching device connects the drain line to a relatively thinner ground layer than when determination is made that the frequency is not in the FM bandwidth.

What is claimed is:

1. An electronic control unit comprising:
a circuit board including a plurality of layers, the layers including a plurality of ground layers having different thicknesses from one another;
a drain line connected to the circuit board;
a switching device configured to selectively connect the drain line to one of the plurality of ground layers based on a frequency of an electromagnetic wave inside a vehicle cabin; and
a controller configured to control the connection of the switching device based on the frequency of the electromagnetic wave inside the vehicle cabin.

2. The electronic control unit according to claim 1, wherein the controller is configured to perform control such that the switching device connects the drain line to a relatively thicker ground layer when a radio frequency that is a frequency of an electric wave of radio as the electromagnetic wave inside the vehicle cabin is low than when the radio frequency is high.

3. The electronic control unit according to claim 2, wherein the circuit board includes two ground layers as the ground layers, and the controller is configured to perform control such that the switching device connects the drain line to a thinner ground layer out of the two ground layers when the radio frequency belongs to an FM bandwidth, and perform control such that the switching device connects the drain line to a thicker ground layer out of the two ground layers when the radio frequency belongs to an AM bandwidth.

4. The electronic control unit according to claim 1, wherein the thicknesses of the two ground layers are in a range of 50 µm to 120 µm and in a range of 20 µm to 70 µm, respectively.

5. The electronic control unit according to claim 4, wherein the difference in thickness between the two ground layers is 10 µm to 30 µm.

6. The electronic control unit according to claim 1, further comprising:
a resin body configured to hold the circuit board; and
a resin cover configured to cover the circuit board along with the resin body.

7. The electronic control unit according to claim 1, wherein the electronic control unit is attached to a caliper of at least one of a plurality of wheels of a vehicle.

8. A switching control method of an electronic control unit, the electronic control unit including a circuit board that includes a plurality of layers, the layers including a plurality of ground layers having different thicknesses from one another, a drain line connected to the circuit board, a switching device configured to selectively connect the drain line to one of the plurality of ground layers, and a controller, the switching control method comprising:
acquiring, with the controller, a frequency of an electromagnetic wave inside a vehicle cabin;
determining, with the controller, whether or not the acquired frequency is in an FM bandwidth; and
when determination is made with the controller that the acquired frequency is in the FM bandwidth, performing control such that the switching device connects the drain line to a relatively thinner ground layer than when determination is made that the frequency is not in the FM bandwidth.

* * * * *